United States Patent
Elsayed et al.

(10) Patent No.: US 11,329,652 B1
(45) Date of Patent: May 10, 2022

(54) LOADABLE TRUE-SINGLE-PHASE-CLOCKING FLOP-BASED COUNTER

(71) Applicant: SHENZHEN GOODIX TECHNOLOGY CO., LTD., Shenzhen (CN)

(72) Inventors: Mohamed Elsayed, San Diego, CA (US); Scott D Willingham, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/191,704

(22) Filed: Mar. 4, 2021

(51) Int. Cl.
*H03M 1/56* (2006.01)
*H03K 23/40* (2006.01)
*H04N 5/3745* (2011.01)

(52) U.S. Cl.
CPC .............. *H03K 23/40* (2013.01); *H03M 1/56* (2013.01); *H04N 5/37455* (2013.01)

(58) Field of Classification Search
CPC ...... H03M 1/56; H03M 1/123; H03M 1/1023; H03M 1/1295; H03M 1/48; H03M 1/12; H03M 1/1245; H03M 1/162; H03M 1/20; H03M 1/34; H03M 1/36; H04N 5/378; H04N 5/335; H04N 5/37455; H04N 5/3575; H04N 5/363; H04N 5/374; H04N 5/3742; H04N 5/376; H04N 5/3765; H04N 5/37452; H03K 23/62; H03K 21/023; H03K 23/56; H03K 21/026; H03K 21/38; H03K 23/50; H03K 23/00; H03K 19/21; H03K 21/10; H03K 23/86; H03K 4/02; H03K 4/026

USPC .......................... 341/133, 155, 156, 168–170
See application file for complete search history.

(56) References Cited

U.S. PATENT DOCUMENTS

| | | | | |
|---|---|---|---|---|
| 10,326,955 B1* | 6/2019 | Lin | ...................... | H04N 5/3765 |
| 2010/0271525 A1* | 10/2010 | Takahashi | ............ | H04N 5/3742 341/169 |
| 2011/0122274 A1* | 5/2011 | Itzhak | ................... | H04N 5/378 348/222.1 |
| 2014/0367551 A1* | 12/2014 | Hwang | ................ | H03K 21/026 377/107 |

(Continued)

*Primary Examiner* — Linh V Nguyen
(74) *Attorney, Agent, or Firm* — Kilpatrick Townsend & Stockton LLP

(57) ABSTRACT

Techniques are described for implementing counter architectures to support high-speed, high-resolution pixel conversions, such as for CMOS image sensor applications. Embodiments implement a counter block that uses loadable true-signal-phase-clocking (L-TSPC) flops for at least a portion of the counter flops. Some embodiments support efficient two-phase pixel conversion by integrating counting, subtraction, and shifting out in the counter. For example, embodiments can perform a first high-speed pixel conversion phase to obtain a first conversion count. Prior to a second phase, the initial counter can be pre-subtracted by the amount of the first conversion count. Embodiments can then perform a second high-speed pixel conversion phase to obtain a second conversion count. As the second conversion count already has the first conversion count pre-subtracted, the second conversion count represents the final two-phase conversion result. Embodiments can read out this final two-phase conversion result as a digital output of the counter.

17 Claims, 8 Drawing Sheets

(56) References Cited

U.S. PATENT DOCUMENTS

| | | | |
|---|---|---|---|
| 2014/0375858 A1* | 12/2014 | Lee | H04N 5/37455 |
| | | | 348/308 |
| 2015/0326242 A1* | 11/2015 | Shin | H04N 5/378 |
| | | | 341/122 |
| 2016/0249004 A1* | 8/2016 | Saeki | H03L 7/08 |
| 2017/0133418 A1* | 5/2017 | Hwang | H01L 27/14609 |
| 2018/0376090 A1* | 12/2018 | Liu | H04N 5/3745 |

* cited by examiner

LOADABLE TRUE-SINGLE-PHASE-CLOCKING FLOP-BASED COUNTER

FIELD

The invention relates generally to image sensors. More particularly, embodiments relate to counter circuits having loadable true-single-phase-clocking (TSPC) flops for use with pixel conversion in complementary metal-oxide semiconductor (CMOS) image sensors.

BACKGROUND

Many electronic devices include cameras and other features that rely on digital image sensors. For example, most modern smartphones include one or more digital cameras that rely on digital image sensing hardware and software to capture and process images. Such applications often perform image sensing using a complementary metal-oxide semiconductor (CMOS) image sensor (CIS). Over time, consumers have desired increased performance from these image sensors, including higher resolution and lower noise. Further, particularly in portable electronic devices (e.g., with fixed battery capacity), it has been desirable to provide such features without adversely impacting power consumption and dynamic range. For example, analog power drives a significant, if not dominant, part of the power consumption of a modern CIS. As such, implementing a high-performance CIS in a portable electronic device can involve designing analog-to-digital converters (ADCs) and other components within strict power efficiency and noise constraints.

The ADCs in the CMOS image sensors convert analog pixel information into digital code ("pixel conversion"). Many applications place strict design requirements on such ADCs. For example, many applications demand operation in context of very high speed clock (e.g., in the Gigahertz range) and strict limits on power and area consumption. Conventional architectures typically include a ramp-based ADC that compares an analog pixel output voltage (corresponding to signal intensity detected by the pixel) against a reference ramp voltage. For example, a comparator converts the pixel voltage information into a pulse having a width that is proportional to the pixel voltage level. A counter measures the pulse width by counting elapsed clock cycles between the starting edge and ending edges of the pulse. In that way, the magnitude of the count generated by the counter can be a digital value that correlates to the analog pixel output value. The resolution of the output depends on the counter clock. As such, implementing pixel conversion in high-performance image sensors can involve supporting very high-speed counter clocks.

Some applications demand additional pixel conversion features. In some cases, implementation of pixel conversion in high-performance image sensors can involve multiple pixel conversion phases. For example, a first conversion phase is performed without any analog pixel voltage information to obtain a baseline of low-frequency noise and/or other artifacts of the system; and a second phase is then performed with the analog pixel information (and, incidentally, any artifacts in common with the first conversion phase). The final conversion value can then be obtained by subtracting the first-phase value from the second-phase value to effectively remove any effects of those artifacts. In some cases, implementation of pixel conversion in high-performance image sensors can further involve efficient read-out of the outputs from the large numbers of counters. For example, the image sensor may have thousands rows, each having thousands of pixels, such that conversion speed can be impacted by the ability of the architecture to support high-speed efficient read-out of the counter values.

BRIEF SUMMARY OF THE INVENTION

Embodiments provide counter architectures to support high-speed, high-resolution pixel conversions, such as for CMOS image sensor applications. Embodiments implement a counter block that uses loadable true-signal-phase-clocking (L-TSPC) flops for at least a portion of the counter flops. Some embodiments support efficient multi-phase pixel conversion by integrating counting, subtraction, and read-out in the counter. For example, embodiments can perform a first high-speed pixel conversion phase to obtain a first conversion count. Prior to a second phase, the initial counter can be pre-subtracted by the amount of the first conversion count. Embodiments can then perform a second high-speed pixel conversion phase to obtain a second conversion count. As the second conversion count already has the first conversion count pre-subtracted, the second conversion count represents the final two-phase conversion result. The multi-phase conversion can include two or more conversion phases, and embodiments can read out a final multi-phase conversion result as a digital output of the counter.

According to one set of embodiments, a loadable true-single-phase-clocking (L-TSPC) flop-based counter is provided. The L-TSPC flop-based counter includes: an N-bit counter block, a flop loader block, and a shift-out block. The N-bit counter block includes: M L-TSPC flops and N–M data flip-flops (DFFs), the N-bit counter block configured to generate a count value indicating an N-bit number of elapsed clock cycles of an input clock signal received at a clocking input node, such that states of the L-TSPC flops represent M least significant bits (LSBs) of the count value, and states of the N–M data flip-flops (DFFs) represent N–M most significant bits (MSBs) of the count value, wherein M and N are positive integers, and each of the L-TSPC flops is loadable to a deterministic value based on respective set/reset signals; and a TSPC hold sub-block configured to couple with the L-TSPC flops to hold the M LSBs of the count value. The flop loader block is configured to operate in a plurality of modes, such that: the flop loader block is configured, in a reset mode, to obtain M LSB reset values and N–M MSB reset values, to generate the respective set/reset signals to configure each of the L-TSPC flops into a load mode corresponding to a corresponding one of the LSB reset values, and to load each of the N–M MSB reset values to a corresponding one of the N–M DFFs; the flop loader block is configured, in a running mode, to generate the respective set/reset signals to configure the L-TSPC flops into a clock divider mode; and the flop loader block is configured, in a hold mode, to obtain the M LSBs of the count value from the TSPC hold sub-block, and generate the respective set/reset signals to configure each of the L-TSPC flops into the load mode corresponding to reloading a corresponding one of the LSBs of the count value. The shift-out block is coupled with the TSPC hold sub-block to output the M LSBs of the count value, and is coupled with the DFFs to output the N–M MSBs of the count value.

According to another set of embodiments, a method is provided for pixel conversion counting using a loadable true-single-phase-clocking (L-TSPC) flop-based counter. The method includes: running an N-bit counter block having M L-TSPC flops and N–M data flip-flops (DFFs) in a conversion timeframe defined by a ramp start signal and a ramp stop signal to update a count value by configuring the L-TSPC flops and the DFFs to operate in a clock divider mode to count a number of clock cycles of an input clock signal as elapsed over the conversion timeframe, such that the L-TSPC flops represent M least significant bits (LSBs) of the count value, and the DFFs represent N–M most significant bits (MSBs) of the count value; holding the LSBs of the count value, subsequent to the running, by latching the LSBs of the count value in TSPC latches coupled with the L-TSPC flops; and outputting the count value by outputting the LSBs of the count value from the TSPC latches and by outputting the MSBs of the count value from the DFFs.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
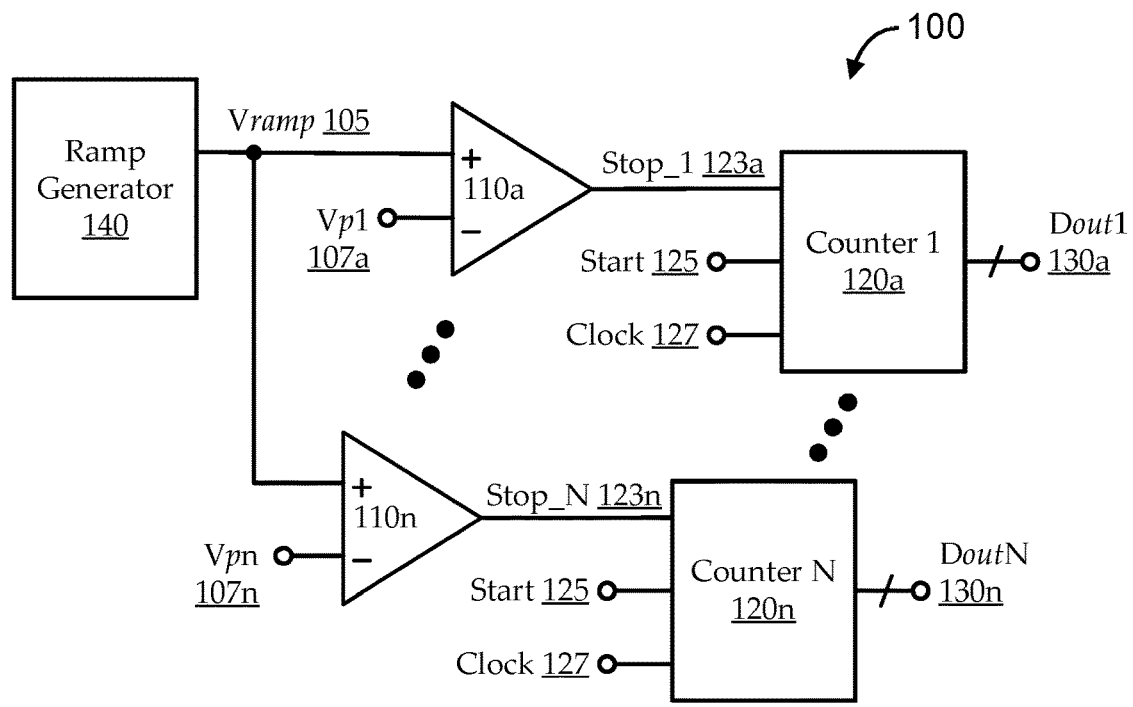
FIG. 1 shows a portion of an illustrative pixel analog-to-digital converter (ADC).

FIG. 1 shows a portion of an illustrative pixel analog-to-digital converter (ADC) 100. As illustrated, the portion of the ADC 100 includes a pixel ramp voltage generator 140 coupled with a number of comparators 110, which are coupled with a number of counters 120. The pixel ramp voltage generator 140 generates a ramp voltage (Vramp) 105, which can essentially be a voltage that begins at a low starting level and charges to a high ending level in a substantially linear fashion. For example, a current generator begins flowing a charging current through a load (e.g., a capacitive load), thereby charging the load. As the load charges, a voltage across the load can increase substantially linearly over time.

As illustrated, the ramp voltage 105 can be received at one of the inputs (e.g., the negative input) of each of the comparators 110. In many typical ADC architectures for image sensors, the same ramp voltage 105 can be shared by multiple comparators 110, such as by all comparators 110 for each row of pixels. The other input (e.g., the positive input) of each of the comparators 110 can be coupled with a respective pixel response voltage (Vp) 107 for a corresponding pixel. For example, the pixel response voltage 107 is an analog output of the pixel corresponding to the intensity of light (e.g., number of photons) detected by a photodetector element of the pixel. Each comparator 110 compares its respective pixel response voltage 107 to the ramp voltage 105. The ramp voltage 105 can be configured so that the ramp begins at a level assumed to be below any pixel response voltage 107, and so that the ramp ends at a level assumed to be above any pixel response voltage 107. At some point in a pixel conversion cycle, the linearly changing level of the ramp voltage 105 will cross the level of the pixel response voltage 107, thereby triggering a change in state of the output of the corresponding comparator 110.

In such a configuration, the output of each comparator 110 is effectively be a pulse that begins at a first point in time corresponding to the ramp voltage beginning to increase, and that ends at a second point in time corresponding to the ramp voltage 105 level crossing the pixel response voltage 107 level. As such, different levels of pixel response voltage 107 will result in different timing for the state change at the output of the comparator 110, and the width of the pulse between the first and second points in time correlates to a measure of the pixel response voltage 107 level. As illustrated, the comparators 110 are coupled with counters 120 that are configured to generate a digital output 130 indicating a measure of the pulse width, and thereby a measure of the pixel response voltage 107 level.

As such, each counter 120 can be coupled with the output of a respective one of the comparators 110 to receive the output signal as a stop signal 123. Each counter 120 also receives a start signal 125 and an input clock signal 127. The start signal 125 indicates the start of the ramp (i.e., when the ramp voltage begins to increase from its starting level). A change in state (e.g., assertion or deassertion) of the start signal 125 triggers the counter 120 to begin counting pulses of the input clock signal 125. The count continues until the counter 120 detects a change in state of the stop signal 123, corresponding to the change in state of the comparator 110 output. At this point, the counter 120 can stop counting and can generate a digital output 130 indicating the obtained count value.

Figure 2:
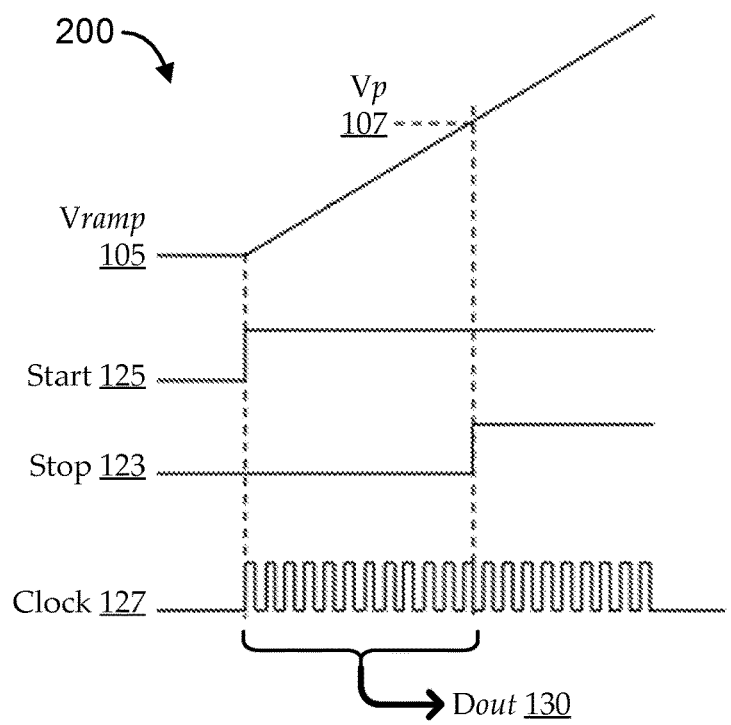
FIG. 2 shows simplified plots of illustrative signals of FIG. 1.

For added clarity, FIG. 2 shows simplified plots of illustrative signals of FIG. 1. As illustrated, a change in state of a start signal 125 (e.g., a rising edge) triggers the ramp voltage 105 to begin rising from some low starting level. The ramp voltage 105 can continue to rise (e.g., substantially linearly) over some period of time. At some point, as the ramp voltage 105 increases, it crosses the level of an illustrative pixel response voltage 107. For example, the pixel response voltage 107 corresponds to a detected intensity of a photodetector at a pixel corresponding to the pixel response voltage 107. As illustrated in FIG. 1, when the rising level of the ramp voltage 105 crosses the pixel response voltage 107 level, the state of the output of a corresponding comparator 110 changes, and that output can be used as the stop signal 123. It can be seen in FIG. 2 that the stop signal 123 changes state responsive to the level of the ramp voltage 105 crossing the pixel response voltage 107 level.

An input clock signal 127 is also shown. The input clock signal 127 may be any suitable periodic signal, but is typically a square wave with approximately 50-percent duty cycle. As described with reference to FIG. 1, a counter 120 can be triggered to start counting cycles of the input clock signal 127 (e.g., rising edges, or other detectable state changes) responsive to the start signal 125 and to stop counting cycles of the input clock signal 127 responsive to the stop signal 123. The number of elapsed cycles of the input clock signal 127 between the start signal 125 and the stop signal 123 can be used as a measure of the pixel response voltage 107 and can be output by the counter 120 as the digital output 130.

The process of beginning the ramp, detecting respective timing of ramp level crossings for all the pixels in a row, and ending the ramp can be considered as a pixel row conversion cycle. Many image sensor designs use a two-phase conversion cycle, whereby two conversion phases are used in each cycle for each pixel in each row to generate an ADC result. For example, in a first phase, a reset voltage on each pixel line is converted. The reset voltage does not include image information, but it tends to include various noise artifacts, such as low-frequency noise from the pixel ramp voltage generator 140 and the comparators 110. In a second phase, the reset voltage plus the image information are converted. By subtracting the two outputs, the reset voltage is cancelled out, while image information is retained. Because some of the noise is common in both phases, the subtraction tends to reduce the noise influences of the pixel ramp voltage generator 140 and the comparators 110 (e.g., much of the low-frequency noise), as long as that noise does not appreciably change between the two conversion phases.

Conventional pixel conversion processes tend to have various limitations. For example, conventional architectures for high-performance image sensors can include many thousands of comparators 110 and counters 120, which can consume appreciable power and area. Further, each pixel conversion cycle can consume appreciable time. For example, in a conventional two-phase pixel conversion process, conversion of each pixel can involve obtaining a first conversion count (i.e., a count of elapsed cycles of the input clock signal 127 between the start signal 125 and the stop signal 123), reading out the first conversion count, obtaining a second conversion count, reading out the second conversion count, and subtracting the two conversion counts to obtain a final digital conversion result. To support high resolutions in high-performance applications, it can be desirable to use higher-bit counters (e.g., at least 10 bits) and high-speed clocks. However, the maximum clock speed, maximum number of counter bits, and/or other design features can conventionally be limited by other aspects of the architecture, such as a maximum clock speed of flops used in the counter, maximum shift-out speed, etc. As such, even with relatively high-speed conventional architectures, two-phase pixel conversion processes can consume appreciable time and/or other resources.

Embodiments described herein include novel types of counter architectures to support high-speed, high-resolution pixel conversions, such as in CMOS image sensor applications. Embodiments implement a counter block that uses loadable true-signal-phase-clocking (L-TSPC) flops for at least a portion of the counter flops. Some embodiments support efficient two-phase pixel conversion by integrating counting, subtraction, and shift-out in the counter. For example, embodiments can perform a first high-speed pixel conversion phase to obtain a first conversion count. Prior to a second phase, the initial counter can be pre-subtracted by the amount of the first conversion count. Embodiments can then perform a second high-speed pixel conversion phase to obtain a second conversion count. As the second conversion count already has the first conversion count pre-subtracted, the second conversion count represents the final two-phase conversion result. Embodiments can read out this final two-phase conversion result as a digital output of the counter. While some embodiments are described herein with reference to two-phase pixel conversion cycles, novel techniques described herein can be used to support pixel conversion cycles with any suitable number of phases. For example, some embodiments can be configured to support a single-phase conversion, and other embodiments can be configured to support more than two conversion phases. For example, each pixel conversion cycle can include a first set of one or more conversion phases to obtain and/or pre-subtract conversion counts without a pixel signal (e.g., to profile and reduce noise), and a second set of one or more conversion phases to count and/or pre-subtract conversion counts with the pixel signal.

Figure 3:
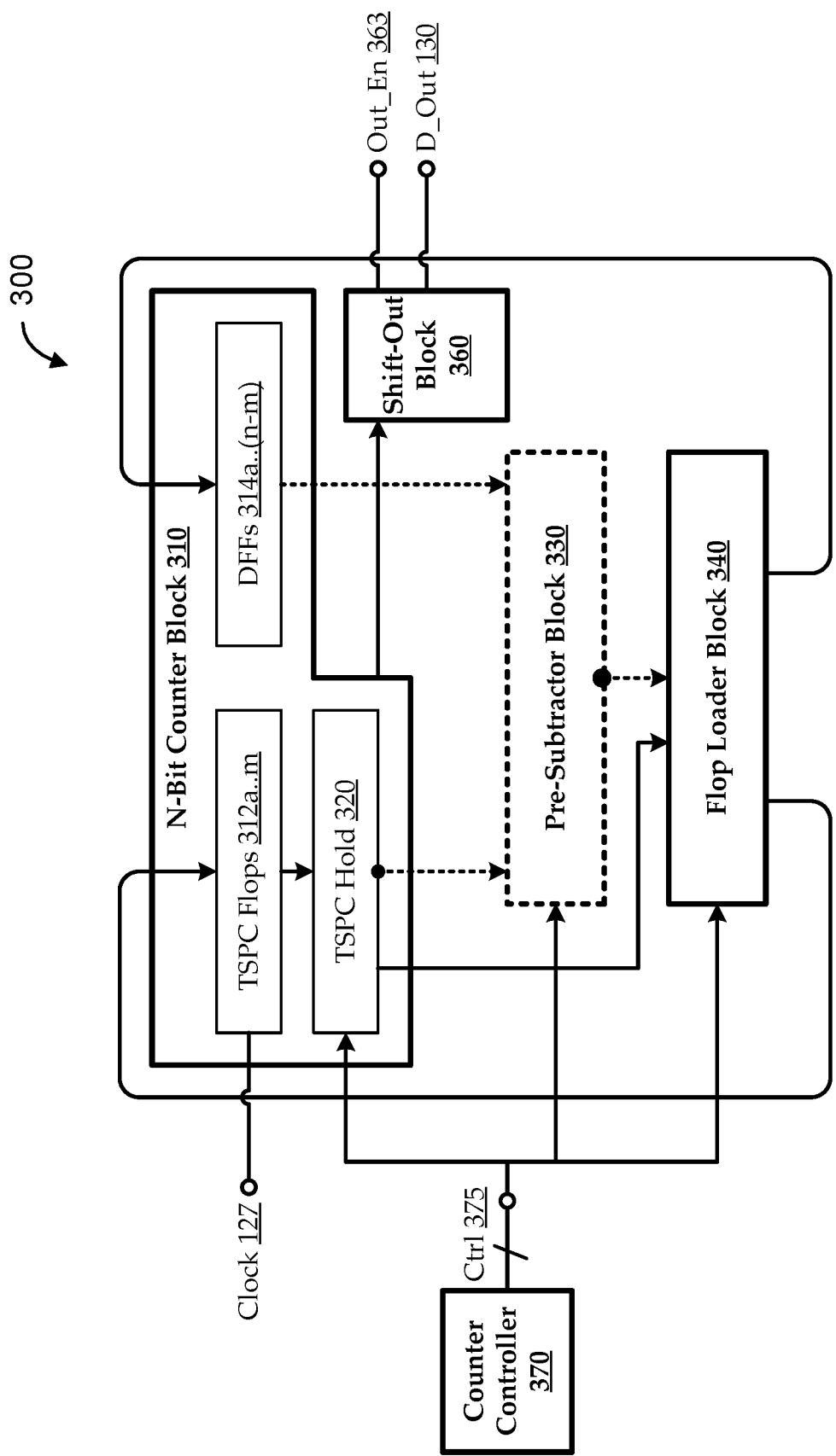
FIG. 3 shows a novel loadable true-single-phase-clocking (L-TSPC) flop-based counter architecture, according to embodiments described herein.

FIG. 3 shows a novel loadable true-single-phase-clocking (L-TSPC) flop-based counter architecture 300, according to embodiments described herein. Embodiments of the counter architecture 300 include an N-bit counter block 310, a flop loader block 340, and a shift-out block 360. As illustrated, the N-bit counter block 310 includes N flops arranged as a chain of clock dividers. For example, in a chain of N flops, each flop can be configured so that its output state toggles with each rising edge (or, alternatively, with each falling edge) of its input, and its input can be coupled with the output from the previous flop in the chain (or with the input clock signal 127 in the case of the first flop in the chain). In such a configuration, the output of each flop will toggle at half the frequency of its preceding flop; if the frequency of the input clock signal 127 is F, the output of each jth flop toggles at a frequency of $F/2^j$. For example, if the input clock signal 127 is a 2.5 Gigahertz (GHz) clock signal, the output of the first flop in the N-bit counter block 310 is 1.25 GHz, the output of the second flop in the N-bit counter block 310 is 612.5 Megahertz, and so on. As such, the N outputs from the N flops in the N-bit counter block 310 correspond to an N-bit count of the number of cycles of the input clock signal 127 since a count began (e.g., since the states of all the flops in the N-bit counter block 310 were reset to '0'). For this N-bit count, the first flop in the N-bit counter block 310 (i.e., the flop directly coupled with the input clock signal 127) will be the least significant bit, and the last flop in the N-bit counter block 310 will be the most significant bit.

As illustrated, the N-bit counter block 310 includes loadable true-single-phase-clocking (L-TSPC) flops 312. Embodiments of L-TSPC flops 312 are described in U.S. patent application Ser. No. 17/164,722, titled "LOADABLE TRUE-SINGLE-PHASE-CLOCKING FLOP," filed on Feb. 1, 2021, the entire disclosure of which is hereby incorporated by reference. Generally, each L-TSPC flops 312 is configured to operate, responsive to a set of control signals, in a selected one of at least a normal mode, a set loading mode, and a reset loading mode. In the set loading mode, control signals (e.g., set and reset signals) can be configured to hold the output (e.g., Q-bar) of the L-TSPC flop 312 in a first state (e.g., HIGH); and in the reset loading mode, the control signals can be configured to hold the output of the L-TSPC flop 312 in a second state (e.g., LOW) that is the complement of the first state. In the set and reset loading modes, the output of the L-TSPC flop 312 is held in a deterministic state and is not impacted by changing states of an input clocking signal (e.g., or absence of such a signal).

In the normal mode, the L-TSPC flop 312 can substantially mimic operation of a conventional TSPC flop, such that the state of the output of the L-TSPC flop 312 can be a function of changes in the state of the input clocking signal. For example, by coupling the output of the L-TSPC flop 312 with its input, the L-TSPC flop 312 can effectively operate as a clock divider that supports very high speed clocking. However, it is well established that conventional TSPC flops (and, similarly, those of L-TSPC flops 312 when operating in normal mode) tend to fail when operating below a relatively high minimum clocking frequency. If clocking of the flop stops, or becomes too slow, the outputs of the TSPC flop can quickly devolve to an indeterminate states because of parasitic capacitances and other electrical factors, and there can be leakage between the power supply level and ground level through the TSPC flop. As such, TSPC flops tend to be used in high-speed, always-running clock circuits, such as in a frequency divider of a phase-locked loop (PLL) in a high-speed clock.

Conventionally, TSPC flops tend not to be used in digital counter circuits, like the N-bit counter block 310, in which the clocking frequency is re-divided by each flop stage of the counter. For example, even if the frequency of the input clock signal 127 is fast enough to support TSPC flop operation, input clocking is already less than five percent as fast by the fifth flop in the counter and may be too slow for reliable TSPC operation. Further, in a CMOS image sensor context, there may be thousands of such flops used to support conversion of each row of pixels, which can multiply any concerns stemming from leakage through the TSPC flops (e.g., increased power consumption and heat, reduced performance, etc.). As such, TSPC flops are conventional not used for counter circuits.

As illustrated, the N-bit counter block 310 includes both L-TSPC flops 312 and data flip-flops (DFFs) 314. The remaining flops in the N-bit counter block 310 can be implemented as a DFF 314, or any suitable other flop architecture. In some implementations, then, the M least-significant bits (LSBs) of the N-bit counter block 310 are implemented as L-TSPC flops 312, and the remaining N–M most-significant bits (MSBs) of the N-bit counter block 310 are implemented as DFFs 314. As noted above, if the input clock signal 127 frequency is "F," each kth L-TSPC flop 312k will be clocked at a divided down frequency of $F/2^{(k-1)}$. As such, the number of L-TSPC flops 312 (shown as an integer number M) can be selected to ensure that $F/2^{(M-1)}$ is above a predetermined minimum frequency for reliable L-TSPC flop 312 operation. For example, the N-bit counter block 310 can be implemented with only L-TSPC flops 312 (i.e., no DFFs 314), if F is sufficiently high and/or N is sufficiently low, such that $F/2^{(N-1)}$ supports reliable operation of the Nth L-TSPC flop 312.

During some stages of the pixel conversion process, the N-bit counter block 310 can generate a count value indicating an N-bit number of elapsed clock cycles of the input clock signal 127 received at a clocking input node. The output states of the flops in the N-bit counter block 310 can indicate the count value. For example, states of the L-TSPC flops 312 represent the M LSBs of the count value (q<m:1>, or q<m–1:0>), and states of the N–M DFFs represent N–M MSBs of the count value (q<N:m+1>, or q<N–1:m>). As described more fully herein, the N-bit counter block 310 further includes a TSPC hold sub-block 320 configured to couple with the L-TSPC flops 320 to hold the M LSBs of the count value. For example, the TSPC hold sub-block 320 can latch the M LSBs when the input clock signal 127 is stopped at the input to the first L-TSPC flop 312a, such as corresponding to the stop signal 123 being asserted at the output of a connected comparator 110 (not shown).

Embodiments of the flop loader block 340 are configured to operate in a plurality of modes, including at least a reset mode, a running mode, and a hold mode. In the reset mode, the flop loader block 340 is configured to obtain M LSB reset values and N–M MSB reset values. The values can be all '0's, or any other suitable initial set of N bits with which to initialize the N-bit counter block 310. The flop loader block 340 can generate respective set/reset signals to configure each of the L-TSPC flops 312 into a load mode corresponding to a corresponding one of the LSB reset values, and can load each of the N–M MSB reset values to a corresponding one of the N–M DFFs 314. For example, generating the respective set/reset signals can involve, generating a respective set signal and a respective reset signal for each of the L-TSPC flops 312. For a given L-TSPC flop 312, asserting the set signal and deasserting the reset signal may set the output of the L-TSPC flop 312 to '1' at the "Q" output (and '0' at the "Q_bar" output); and asserting the reset signal and deasserting the set signal may set the output of the L-TSPC flop 312 to '0' at the Q output (and '1' at the Q_bar output).

In the running mode, the flop loader block 340 can be configured to generate the respective set/reset signals to configure the L-TSPC flops into a clock divider mode. For example, deasserting both the set and reset signals for a particular L-TSPC flop 312 can configure that L-TSPC flop 312 to operate in the clock divider (e.g., normal) mode. As described above, in this mode, the N-bit counter block 310 can effectively operate as a counter. In the hold mode, the flop loader block 340 can be configured to obtain the M LSBs of the count value from the TSPC hold sub-block 320, and generate the respective set/reset signals to configure each of the L-TSPC flops 312 into the load mode corresponding to reloading a corresponding one of the LSBs of the count value. For example, the M LSBs of the count value at the end of a counting cycle (e.g., when the flop loader block 340 transitions from the running mode to the hold mode) is latched by the TSPC hold sub-block 320 and fed to the flop loader block 340, which generates corresponding set/reset signals in order to reload the same M LSBs back into the L-TSPC flops 312. In this way, even though clocking of the flops has ceased, the internal nodes and the outputs of the L-TSPC flops 312 can be kept in a deterministic state. In alternative implementations, in the hold mode, the flop loader block 340 can load the L-TSPC flops 312 with any other suitable value (e.g., reload with the reset values, etc.). However, reloading the L-TSPC flops 312 with the M LSBs can support certain functionality, such as permitting the count to continue from where it left off.

Embodiments of the shift-out block 360 are configured to generate a digital output 130. For example, the shift-out block 360 is coupled with the TSPC hold sub-block 320 to output the M LSBs of the count value, and the shift-out block 360 is coupled with the DFFs 314 to output the N–M MSBs of the count value. In some implementations, the shift-out block 360 is controlled by an output enable signal 363. For example, asserting the output enable signal 363 causes read out of the N count value bits.

Some embodiments of the L-TSPC flop-based counter architecture 300 further include a pre-subtractor block 330 coupled with the N-bit counter block 310. The pre-subtractor block 330 can receive the count value and output an inverted count value. For example, the pre-subtractor block 330 can be coupled with the TSPC hold sub-block 320 to receive the M LSBs of the count value, and can be coupled with the DFFs 314 to receive the N−M MSBs of the count value. The pre-subtractor block 330 can invert the bits of the count value, such as by latching the bits and outputting the complement of each bit (e.g., the inverted count value can effectively be the 1's complement of the count value). The inverted count value can then be provided as an input to the flop loader block 340. In such embodiments, the flop loader block 340 can be configured further to operate selectively in a pre-subtract mode to obtain the inverted count value from the pre-subtractor block 330. In such a mode, the flop loader block 340 can generate the respective set/reset signals to configure each of the L-TSPC flops 312 into a load mode corresponding to a corresponding one of M LSBs of the inverted count value, and to load each of N−M MSBs of the inverted count value to a corresponding one of the N−M DFFs 314.

Embodiments of the L-TSPC flop-based counter architecture 300 can also include a counter controller 370, which can generate and provide any suitable control signals 375 to the various components of the L-TSPC flop-based counter. As illustrated, the counter controller 370 can be coupled with at least the N-bit counter block 310 and the flop loader block 340. In some implementations, the counter controller 370 uses the control signals 375 to direct operation of the N-bit counter block 310 and the flop loader block 340 to implement a single-phase conversion. For example, in a first timeframe, the counter controller 370 uses the control signals 375 to direct the flop loader block 340 to operate in the reset mode to cause resetting of the count value in the N-bit counter block 310 according to the LSB reset values and MSB reset values (e.g., to all '0's). In a second timeframe, the counter controller 370 uses the control signals 375 to direct the flop loader block 340 to operate in the running mode to cause the N-bit counter block 310 to update the count value to indicate a clock running duration counted in the second timeframe. In a third timeframe, the counter controller 370 uses the control signals 375 to direct the TSPC hold sub-block 320 to hold the M LSBs of the count value, and to direct the flop loader block 340 to operate in the hold mode to cause reloading of the LSBs of the count value to the L-TSPC flops 312.

In some implementations, the counter controller 370 uses the control signals 375 to direct operation of the N-bit counter block 310, the flop loader block 340, and the pre-subtractor block 330 to implement a two-phase conversion. For example, in a first timeframe, the counter controller 370 uses the control signals 375 to direct the flop loader block 340 to operate in the reset mode to cause resetting of the count value in the N-bit counter block 310 according to the LSB reset values and MSB reset values. In a second timeframe, the counter controller 370 uses the control signals 375 to direct the flop loader block 340 to operate in the running mode to cause the N-bit counter block 310 to update the count value to a first-updated count value indicating a first-phase clock running duration as counted during the second timeframe (i.e., a first conversion count). In a third timeframe, the counter controller 370 uses the control signals 375 to direct the TSPC hold sub-block 320 to hold the M LSBs of the first-updated count value, and to direct the flop loader block 340 to operate in the hold mode to cause reloading of the LSBs of the first-updated count value to the L-TSPC flops 312. In a fourth timeframe, the counter controller 370 uses the control signals 375 to direct the flop loader block 340 to operate in the pre-subtract mode to cause updating of the count value to a second-updated count value indicating the inverted count value obtained from the pre-subtractor block 330. In a fifth timeframe, the counter controller 370 uses the control signals 375 to direct the flop loader block 340 to operate in the running mode to cause the N-bit counter block 310 to update the count value to a third-updated count value indicating a second-phase clock running duration as counted during the fifth timeframe (i.e., a second conversion count that has the first conversion count pre-subtracted). In a sixth timeframe, the counter controller 370 uses the control signals 375 to direct the TSPC hold sub-block 320 to hold the M LSBs of the third-updated count value, and to direct the flop loader block 340 to operate in the hold mode to cause reloading of the LSBs of the third-updated count value to the L-TSPC flops 312.

In some implementations, the counter controller 370 is also configured to at least partially direct operation of the shift-out block 360. For example, the output enable signal 363 can be one of the control signals 375 provided by the counter controller 370. In such implementations, after having obtained a final conversion count in a single-phase or two-phase pixel conversion cycle, the counter controller 370 can use the control signals 375 to direct the shift-out block 360 to output the count value from the N-bit counter block 310. For example, in the single-phase conversion cycle described above, the shift-out can be performed in a fourth timeframe, in which the counter controller 370 can use the control signals 375 to direct the shift-out block 360 to output the count value from the N-bit counter block 310. In the two-phase conversion cycle described above, the shift-out can be performed in a seventh timeframe, in which the counter controller 370 uses the control signals 375 to direct the shift-out block 360 to output the third-updated count value from the N-bit counter block 310. Some implementations of the two-phase conversion cycle can include an optional shift-out also after the first conversion count is obtained (e.g., after the third timeframe). Other implementations can support additional features. For example, implementations can be designed to support pixel conversion cycles with more than two phases. As another example, implementations can be designed to continue counting from a previous conversion count result (e.g., by using the hold mode of the flop loader block 340 and the loading modes of the L-TSPC flops 312 to maintain the previous conversion count result until the count resumes). As another example, implementations can be designed to start counting from any desired initial (e.g., by using the reset mode of the flop loader block 340 and the loading modes of the L-TSPC flops 312 to set desired initial values in the flops of the N-bit counter block 310).

Embodiments of the counter architecture 300, and/or any components thereof, can be implemented in any suitable manner. In some embodiments, the counter controller 370 and/or the flop loader block 340 include, or are implemented on, a central processing unit CPU, an application-specific integrated circuit (ASIC), an application-specific instruction-set processor (ASIP), a graphics processing unit (GPU), a physics processing unit (PPU), a digital signal processor (DSP), a field-programmable gate array (FPGA), a programmable logic device (PLD), a controller, a microcontroller unit, a reduced instruction set (RISC) processor, a complex instruction set processor (CISC), a microprocessor, or the like, or any combination thereof. Further, components can be combined or separated without departing from the scope of the invention. Further, each instance of the counter architecture 300 can include its own instance of certain components, or certain components can be shared among instances. For example, a single counter controller 370 can be used to generate control signals 375 for a large number of counter architecture 300 instances (i.e., the counter controller 370 is shared).

FIGS. 4A-4E demonstrate operation of an illustrative L-TSPC flop-based counter 400 in performance of a two-phase pixel conversion cycle, according to various embodiments. The L-TSPC flop-based counter 400 can be an implementation of the L-TSPC flop-based counter architecture 300 of FIG. 3. Each of FIGS. 4A-4E corresponds to one or more particular timeframes of the pixel conversion process. In FIGS. 4A-4E, solid lines generally indicate components and signal paths actively being used in the particular timeframe(s) of the Figure, while dashed lines generally indicate components and signal paths not actively being used in the particular timeframe(s) of the Figure. The use of solid and dashed lines is not intended to limit the scope of embodiments. Rather, the use of solid and dashed lines is intended only to provide added clarity, and represents only a simplified subset of possible implementations.

In the illustrated implementation, an 11-bit counter block is implemented using five L-TSPC flops 312 and six DFFs 314 (i.e., N=11 and M=5, such that N−M=6). The TSPC hold sub-block 320 of FIG. 3 is implemented as five TSPC latches 322, each coupled with a corresponding one of the five L-TSPC flops 312. The latches of the TSPC hold sub-block are referred to as "TSPC latches" only to clearly distinguish those latches from other latches in the L-TSPC flop-based counter 400; the TSPC latches 322 can be implemented using any suitable type of latch without any particular relationship to an TSPC architecture. In one implementation, each TSPC latch 322 is essentially a pair of inverters connected in series, and further coupled with a corresponding L-TSPC flop 312 via a respective switch. The switch can be controlled by a first control signal 375a. While the 11-bit counter is running as a counter, the first control signal 375a can set the switches to be ON. In the ON state, the input of each pair of series-connected inverters is coupled with the output of its corresponding L-TSPC flop 312. When counting stops, the first control signal 375a can toggle state to set the switches to be OFF. In the OFF state, the input of each pair of series-connected inverters is decoupled with the output of its corresponding L-TSPC flop 312; instead, the output of each pair of series-connected inverters is coupled with its own input, such that each TSPC latch 322 essentially latches the last-read output value of its corresponding L-TSPC flop 312. Other latch architectures can be used for the TSPC latches 322. For example, the first control signal 375a can be coupled with an "enable" input of a D-latch, or the like.

In the illustrated implementation, the pre-subtractor block 330 of FIG. 3 is implemented as a set of 11 subtractor latches 332. Again, the latches of the pre-subtractor block are referred to as "subtractor latches" only to clearly distinguish those latches from other latches in the L-TSPC flop-based counter 400; the subtractor latches 332 can be implemented using any suitable type of latch. The black circles at the outputs of the subtractor latches 332 indicate that the output of the subtractor latches 332 is an inverted version of the input signal. In some implementations, such an inversion is implemented by using inverters or other components to invert the outputs of the subtractor latches 332. In other implementations, the architecture of each subtractor latch 332 includes an inverted output. As illustrated, the subtractor latches 332 can be controlled responsive to a second control signal 375b.

In the illustrated implementation, the flop loader block 340 of FIG. 3 is implemented to include a reset sub-block 345, multiplexers (MUXs) 342, and a loading logic sub-block 350. Embodiments of the reset sub-block 345 generate the LSB reset values and MSB reset values. In some implementations, the reset sub-block 345 is a set of registers, or the like, having a set of initial values stored thereon. In some implementations, the reset sub-block 345 is a set of hard-wired nodes, such as nodes hard-wired to a ground reference. In some implementations, the reset sub-block 345 includes a programmable interface, so that the reset values can be changed (e.g., by hardware, software, etc.).

Embodiments of the MUXs 342 can include 11 MUXs 342, each corresponding to a respective flop of the 11-bit counter. For example, a first set of first through Mth MUXs (i.e., the first 5 MUXs 342, or MUX 342a-MUX 342e, in the illustrated implementation) correspond to the M L-TSPC flops 312, and a second set of (M+1)th through Nth MUXs (i.e., the remaining 6 MUXs 342, or MUX 342f-MUX 342k, in the illustrated implementation) correspond to the N−M DFFs 314. Embodiments of the MUXs 342 can each include multiple inputs and an output, where the output effectively corresponds to one of the inputs that is selected responsive to one or more control signals (e.g., third, fourth, and/or fifth control signals 375c, 375d, and/or 375e). Embodiments can be configured to ensure that one of the inputs is always selected (i.e., ensuring that there is no condition in which all the control signals 375 coupled to any given MUX 342 are LOW at the same time, and/or that more than one of the control signals 375 is HIGH at the same time). In some embodiments, this is accomplished by configuring the counter controller 370 to generate at least control signals 375c, 375d, and 375e to meet these criteria. Additionally or alternatively, signals can be logically interconnected in a manner that ensures these criteria are met. For example, as illustrated, the first set of MUXs 342a-342e are each coupled with control signals 375c, 375d, and 375e, with the counter controller 370 configured to ensure that only one of these control signals is active at all times. Also as illustrated, the second set of MUXs 342f-342k are each coupled with control signal 375c and the complement to control signal 375c (illustrated as control signal 375c coupled with the second select input via an inverter). This can ensure that one of the select inputs will always be HIGH. For example, if the counter controller 370 is ensuring that only one of control signals 375c, 375d, and 375e will be HIGH at a time, it can be ensured that the first input of MUXs 342f-342k will be selected when control signal 375c is HIGH, and the second input of MUXs 342f-342k will be selected when either of control signals 375d or 375e is HIGH (and control signal 375c is necessarily LOW).

For each MUX 342, a first of its inputs can be coupled with the reset sub-block 345. For example, the first input of each of the 11 MUXs 342 receives a respective one of the 11 bits of the reset value, with the first set of MUXs 342a . . . e receiving the 5 LSBs, and the second set of MUXs 342f . . . k receiving the 6 MSBs. For each MUX 342, a second of its inputs can be coupled with the subtractor latches 332 of the pre-subtractor block. For example, the second input of each of the 11 MUXs 342 receives a respective one of the 11 bits of the inverted count value, with the first set of MUXs 342a . . . e receiving the 5 LSBs, and the second set of MUXs 342f . . . k receiving the 6 MSBs. For each of the first set of MUXs 342a . . . e, a third of its inputs can be coupled with the 11-bit counter block. For example, the third input of each of the 5 MUXs 342a . . . e receives a respective one of the 5 LSBs of the count value as output by the TSPC latches 322. As described above, the flop loader block can operate in different modes, and those modes can correspond to particular configurations of the MUXs 342 in some embodiments. For example, the flop loader block can be configured in the reset mode at least by setting each of the MUXs 342 to generate its output from its first input (i.e., each MUX 342 output corresponds to a respective bit of the reset value), the flop loader block can be configured in the pre-subtract mode at least by setting each of the MUXs 342 to generate its output from its second input (i.e., each MUX 342 output corresponds to a respective bit of the inverted count value), and the flop loader block can be configured in the hold mode at least by setting each of at least the first set of MUXs 342a . . . e to generate its output from its third input (i.e., each MUX 342a . . . e output corresponds to a respective bit of the held count value).

Embodiments of the loading logic sub-block 350 can be configured to generate the respective set/reset signals based on the respective MUX outputs. For example, each of the L-TSPC flops 312 can be configured into one of a running (e.g., clock divider), set loading, or reset loading mode based on respective states of set and reset signals received by the L-TSPC flops 312. The loading logic sub-block 350 can receive bit values from the MUXs 342 and can convert at least the LSBs into corresponding set/reset signals for the L-TSPC flops 312 so as to deterministically force a state of each L-TSPC flop 312 output. In some implementations, the loading logic sub-block 350 has similar components to support loading of the DFFs 314 to deterministically force a state of each DFF 314 output in accordance with corresponding set/reset signals. Operation of the loading logic sub-block 350 can be controlled by sixth and seventh control signals 375f and 375g. For example, the sixth control signal 375f can control operation of the loading logic sub-block 350 with respect to loading the L-TSPC flops 312, and the seventh control signal 375g can control operation of the loading logic sub-block 350 with respect to loading of the DFFs 314.

Figure 4A:
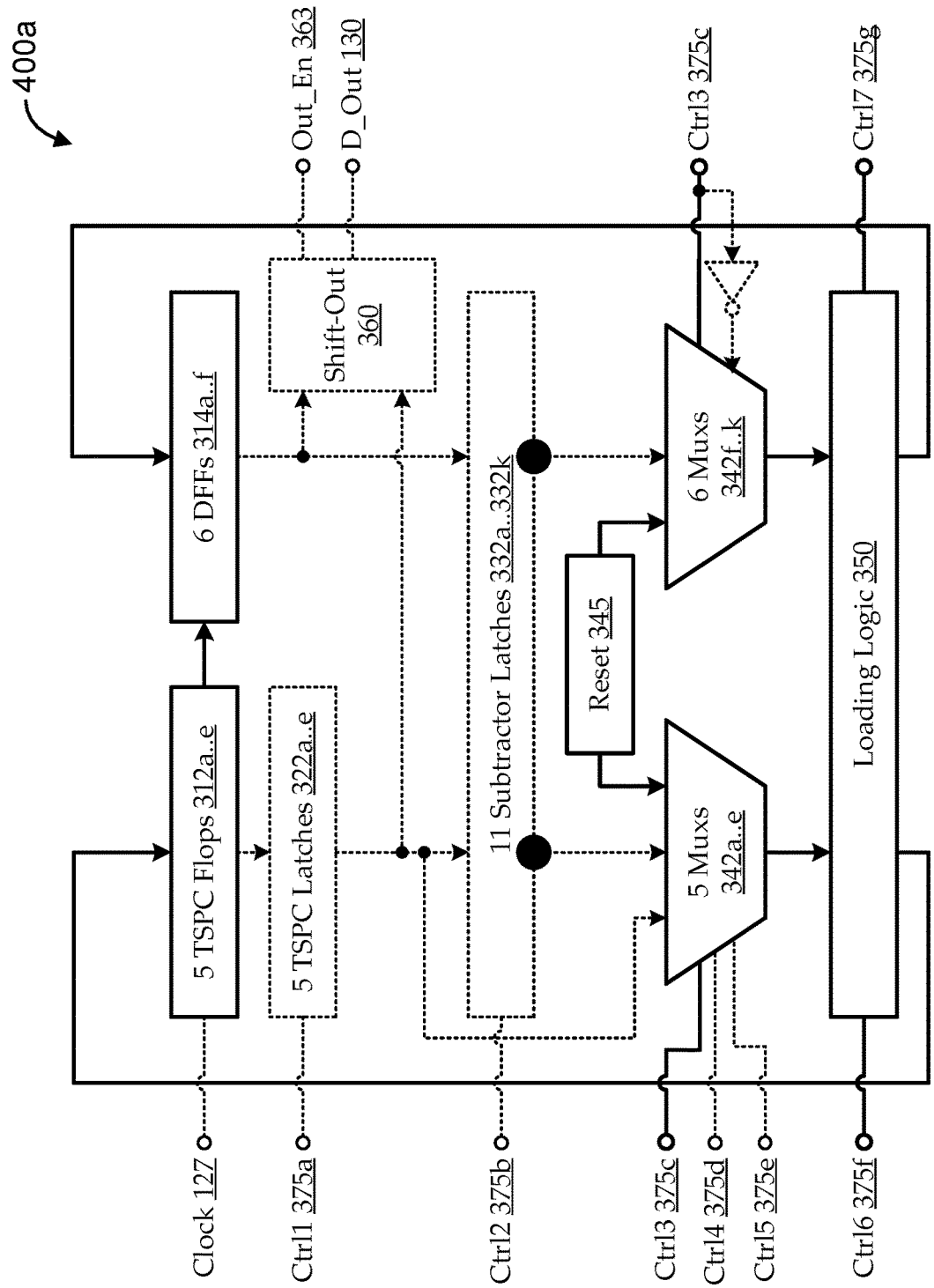
FIGS. 4A-4E demonstrate operation of an illustrative L-TSPC flop-based counter in performance of a two-phase pixel conversion cycle, according to various embodiments.

As described above, embodiments can use the control signals 375 to direct operation of the L-TSPC flop-based counter 400 to implement a pixel conversion cycle, such as a two-phase conversion cycle. FIG. 4A provides an illustrative representation of the L-TSPC flop-based counter 400a in a first timeframe, in which the counter is effectively reset, or initialized. The third control signal 375c is asserted, thereby selecting to generate the output of each MUX 342 according to its first input, corresponding to a respective bit of the reset value from the reset sub-block 345. Responsive to the sixth and seventh control signals 375f and 375g, the loading logic sub-block 350 can convert the bits of the reset value, as received from the MUXs 342, into appropriate loading signals (e.g., set/reset signals) for output to the L-TSPC flops 312 and DFFs 314 of the counter block. As such, the flops of the counter block are initialized to the reset value.

Figure 4B:
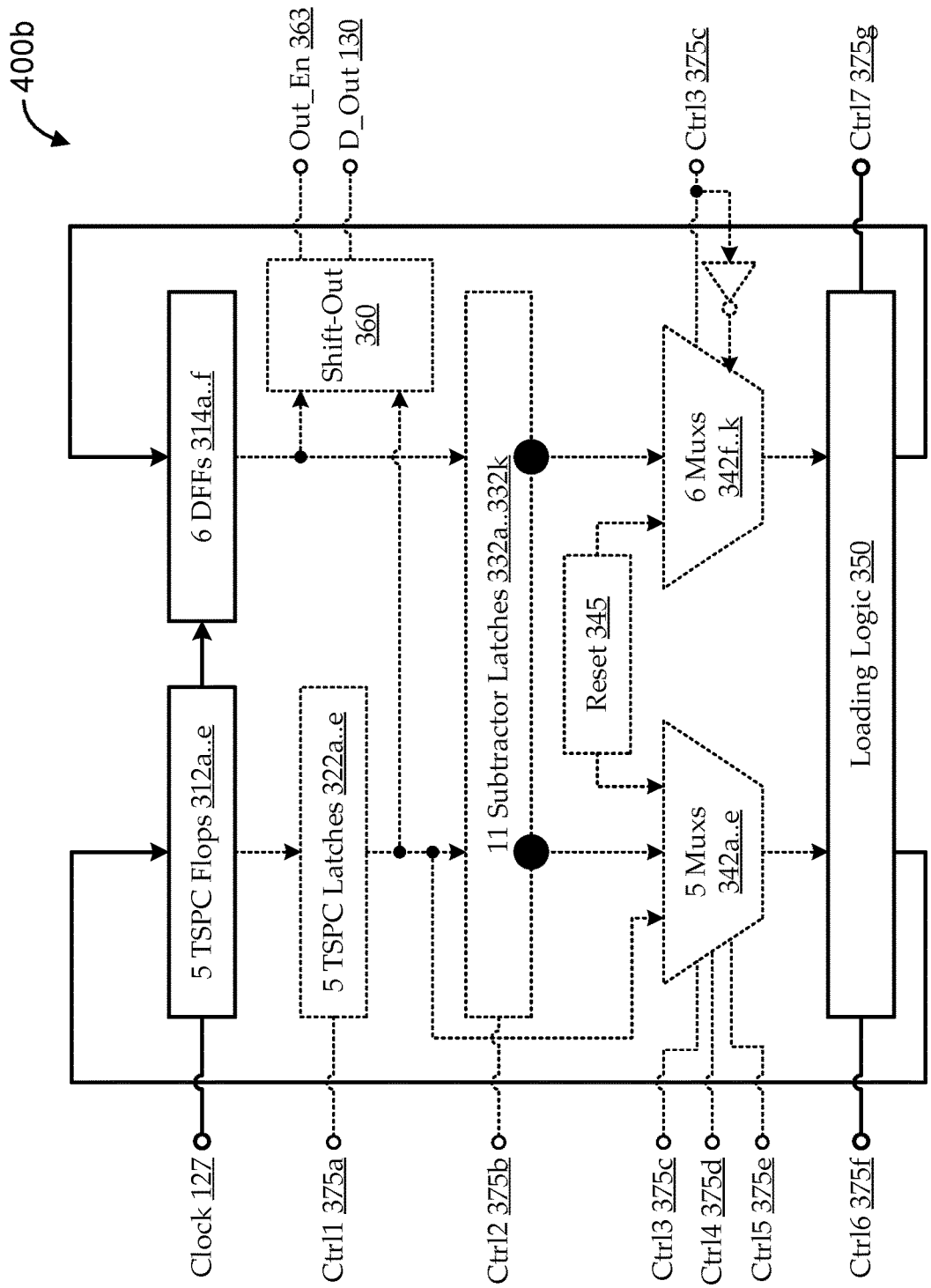

FIG. 4B provides an illustrative representation of the L-TSPC flop-based counter 400b in a second timeframe, in which a first conversion count is obtained. The sixth and seventh control signals 375f and 375g, or any other suitable logic, can be used to direct the loading logic sub-block 350 to generate loading signals (e.g., set/reset signals) to configure the flops of the counter into a normal (e.g., clock divider) mode. For example, the loading logic sub-block 350 can configure the set and reset inputs of all the L-TSPC flops 312 and DFFs 314 to all '0's. This can cause each flop to respond to its clock input to implement desired counter functionality. In the context of pixel conversion, at the end of the second timeframe, the output state of the flops represents an 11-bit binary count value of the number of elapsed clock cycles between the start and stop of the clocking (e.g., the start and stop of the ramp).

Figure 4C:
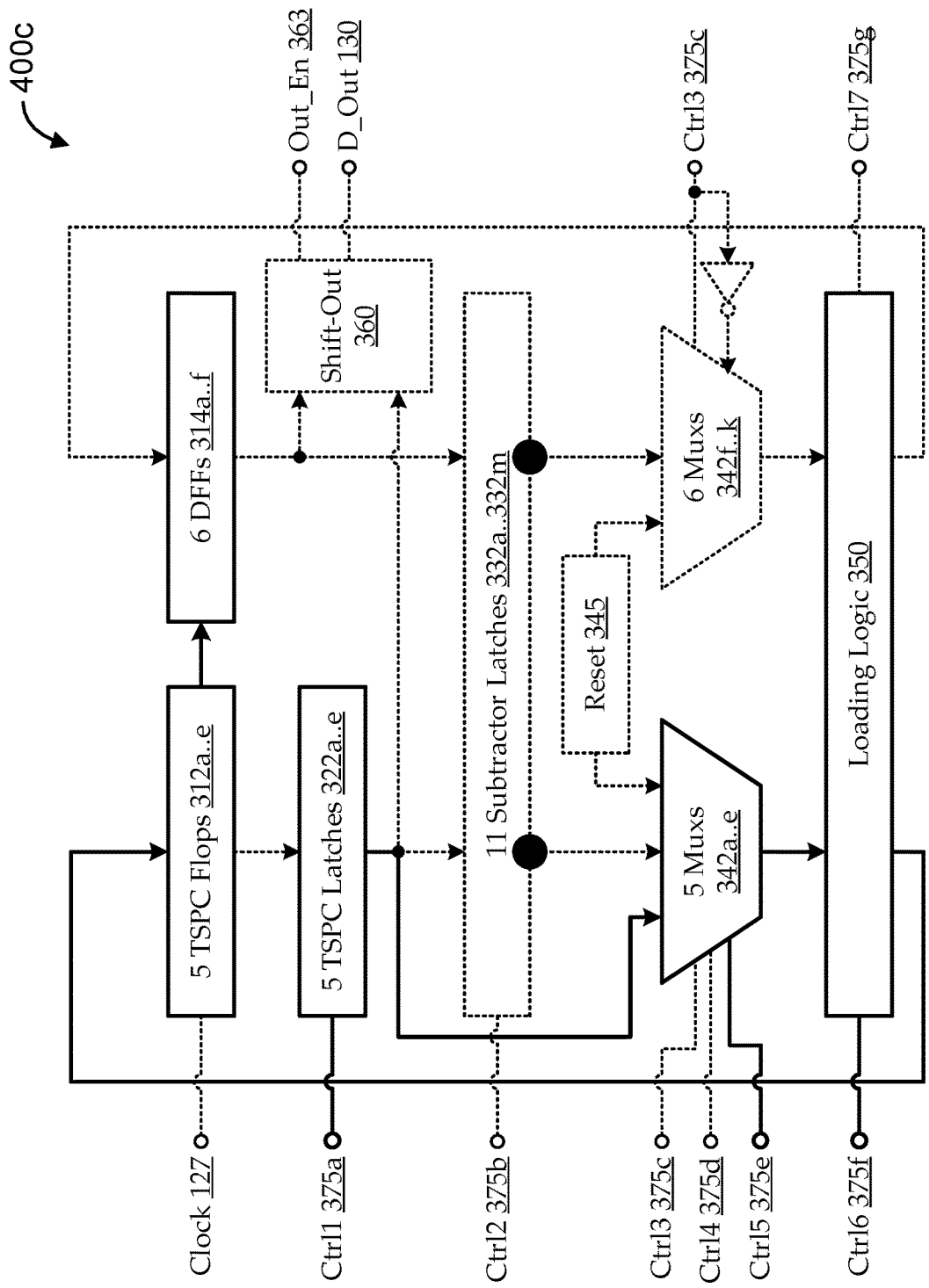

FIG. 4C provides an illustrative representation of the L-TSPC flop-based counter 400c in a third timeframe, in which the obtained count value from the second timeframe is held (e.g., for subsequent shift-out and/or pre-subtraction). The first control signal 375a is asserted to latch the LSBs of the count value in the TSPC latches 322. The fifth control signal 375e is asserted, thereby selecting to generate the output of each of the first set of MUXs 342a . . . e according to its third input, which corresponds to a respective one of the LSBs of the count value as received from a respective one of the TSPC latches 322. Responsive to the sixth control signal 375f, the loading logic sub-block 350 can convert the LSBs of the count value, as received from the first set of MUXs 342a . . . e, into appropriate loading signals (e.g., set/reset signals) for output to the L-TSPC flops 312. As noted above, absent a high-speed clocking input, the states of the L-TSPC flops 312 can quickly become indeterminate, which can permit undesirable current leakage and/or other concerns. By using the loading logic sub-block 350 to reload the count values back into the L-TSPC flops 312, the L-TSPC flops 312 can be maintained in a determinate state, and such leakage and/or other concerns can be avoided. In some embodiments, no further signaling is provided to the DFFs 314 in this timeframe. As the output from the most significant L-TSPC flop 312e (coupled with the least significant DFF 314a) remains unchanging, the DFFs 314 will retain their respective bits of the final count values. For example, as illustrated, the seventh control signal 375g is not being used for loading of the DFFs 314. Notably, in the illustrated configuration, the complement of control signal 375c would necessarily be HIGH, thereby selecting the second input of each of MUXs 342f . . . k. However, since the loading logic sub-block 350 is not loading anything to the DFFs 314, the selected input of MUXs 342f . . . k essentially has no effect.

Figure 4D:
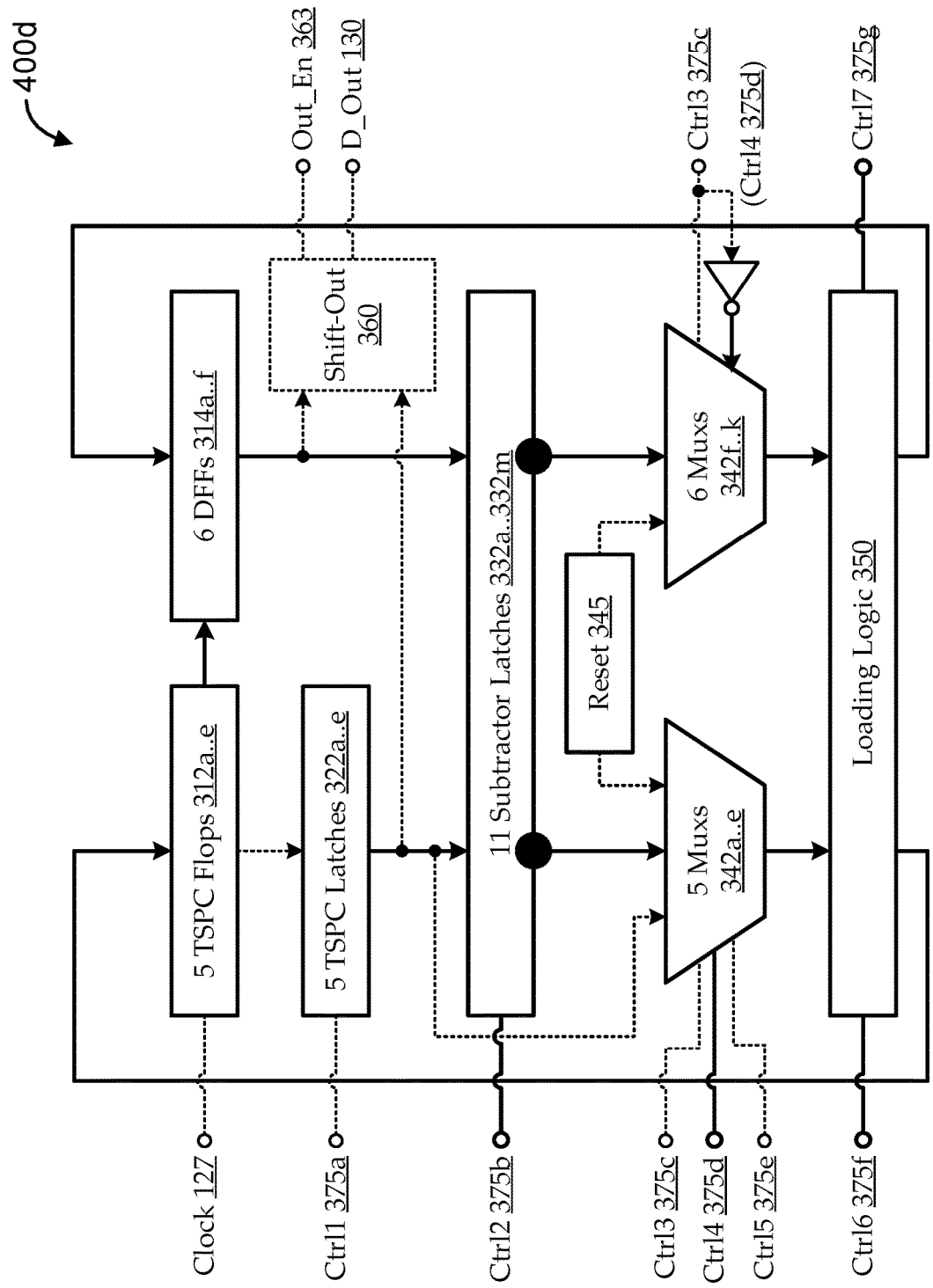

FIG. 4D provides an illustrative representation of the L-TSPC flop-based counter 400d in a fourth timeframe, in which pre-subtraction is performed. The second control signal 375b can be asserted to latch the count value in the subtractor latches 332, such that the output of the pre-subtractor block is the inverted count value. The fourth control signal 375d is asserted, thereby selecting to generate the output of each MUX 342 according to its second input, which corresponds to a respective bit of the inverted count value as received from a respective one of the subtractor latches 332. As described above, the second input selection for MUXs 342f . . . k is controlled by the complement of control signal 375c (not by the fourth control signal 375d). However, the effect is the same in this stage, as indicated in the Figure by "(Ctrl4 375d)" at the second selection input of MUXs 342f . . . k. Responsive to the sixth and seventh control signals 375f and 375g, the loading logic sub-block 350 can convert the bits of the inverted count value, as received from the MUXs 342, into appropriate loading signals (e.g., set/reset signals) for output to the L-TSPC flops 312 and DFFs 314. In effect, this preloads the counter (prior to the second phase of the conversion cycle) with the 1's complement of the count value from the first conversion phase. Adding the second conversion count to the 1's complement of the first conversion count corresponds to subtracting the first conversion count from the second conversion count. For example, if the first conversion count indicates 29 clock cycles, loading the inverted count value into the counter block effectively begins the next count at −30 (i.e., the 1's complement of 29 is negative 30).

Embodiments can proceed by returning to FIG. 4B, which can now be seen as providing an illustrative representation of the L-TSPC flop-based counter 400b in a fifth timeframe, in which a second conversion count is obtained. The second conversion count can be obtained in substantially the same manner as obtaining the first conversion count in the second timeframe; except that the count begins at the inverted count value in the fifth timeframe, rather than beginning at the reset value, as in the second timeframe. Such embodiments can continue by returning to FIG. 4C, which can now be seen as providing an illustrative representation of the L-TSPC flop-based counter 400c in a sixth timeframe, in which the obtained count value from the fifth timeframe is held. The second conversion count can be held in the sixth timeframe in substantially the same manner as holding the first conversion count in the second third. In effect, returning to FIGS. 4B and 4C in the fifth and sixth timeframes results in an obtained and held final conversion count, which represents a second-phase conversion count pre-subtracted by the first-phase conversion count.

Figure 4E:
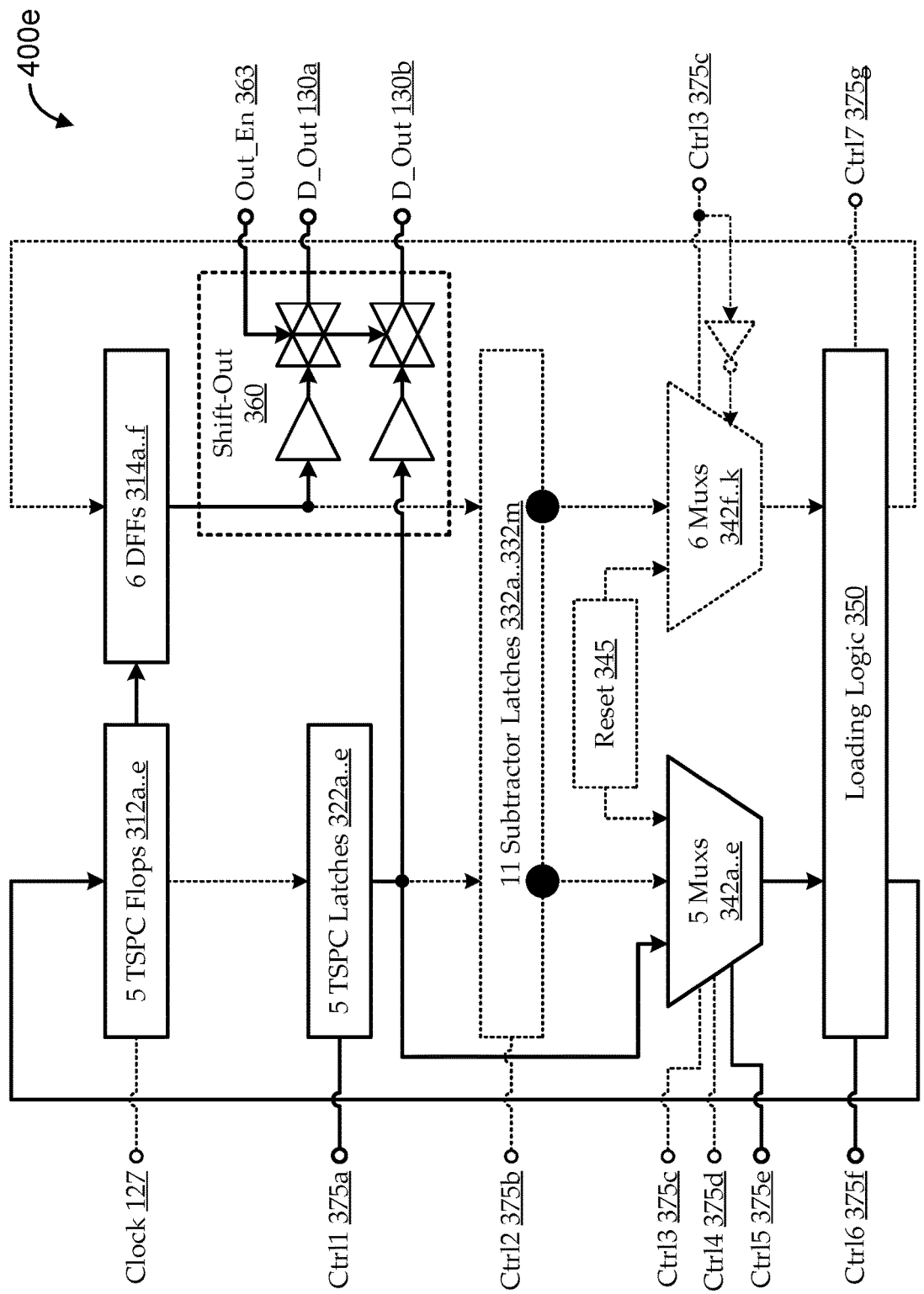

FIG. 4E provides an illustrative representation of the L-TSPC flop-based counter 400e in a seventh timeframe, in which the obtained final conversion count value from the sixth timeframe is read out. The shift-out block 360 is illustrated as including buffers and transmission gates (T-gates). The T-gates can be implemented in any suitable manner, for example, as tri-state buffers. For example, a first set of buffers and T-gates are used to generate a first set of outputs 130b of the LSBs of the final conversion count from the TSPC latches 322, and a second set of buffers and T-gates are used to generate a second set of outputs 130a of the MSBs of the final conversion count from the DFFs 314. Some embodiments do not include buffers and/or T-gates. For example, in some embodiments, the outputs of the flops can directly drive other components of other systems, such as a higher-level shift-out system coupled with many such counters. In other embodiments, the flops directly drive the T-gates without intermediate buffering. In some embodiments, components are configured in the seventh timeframe substantially as in the third and sixth timeframes. For example, the control signals 375 are configured, so that the LSBs of the count value are latched in the TSPC latches 322, the outputs the first set of MUXs 342a ... e represent the latched LSBs of the count value, and the loading logic sub-block 350 is configured to reload the L-TSPC flops 312 with the latched LSBs of the count value. In an alternative implementation, the loading logic sub-block 350 can continue to provide appropriate set/reset signals to the L-TSPC flops 312, even when the outputs of the MUXs 342 are no longer available. In such an implementation, the control signals 375 can be configured effectively to disable the MUXs 342 and corresponding signal paths. Embodiments can assert the output enable signal 363 to provide for shift-out of the final conversion count values from the TSPC latches 322 and the DFFs 314 via the buffers and T-gates of the shift-out block 360.

Figure 5:
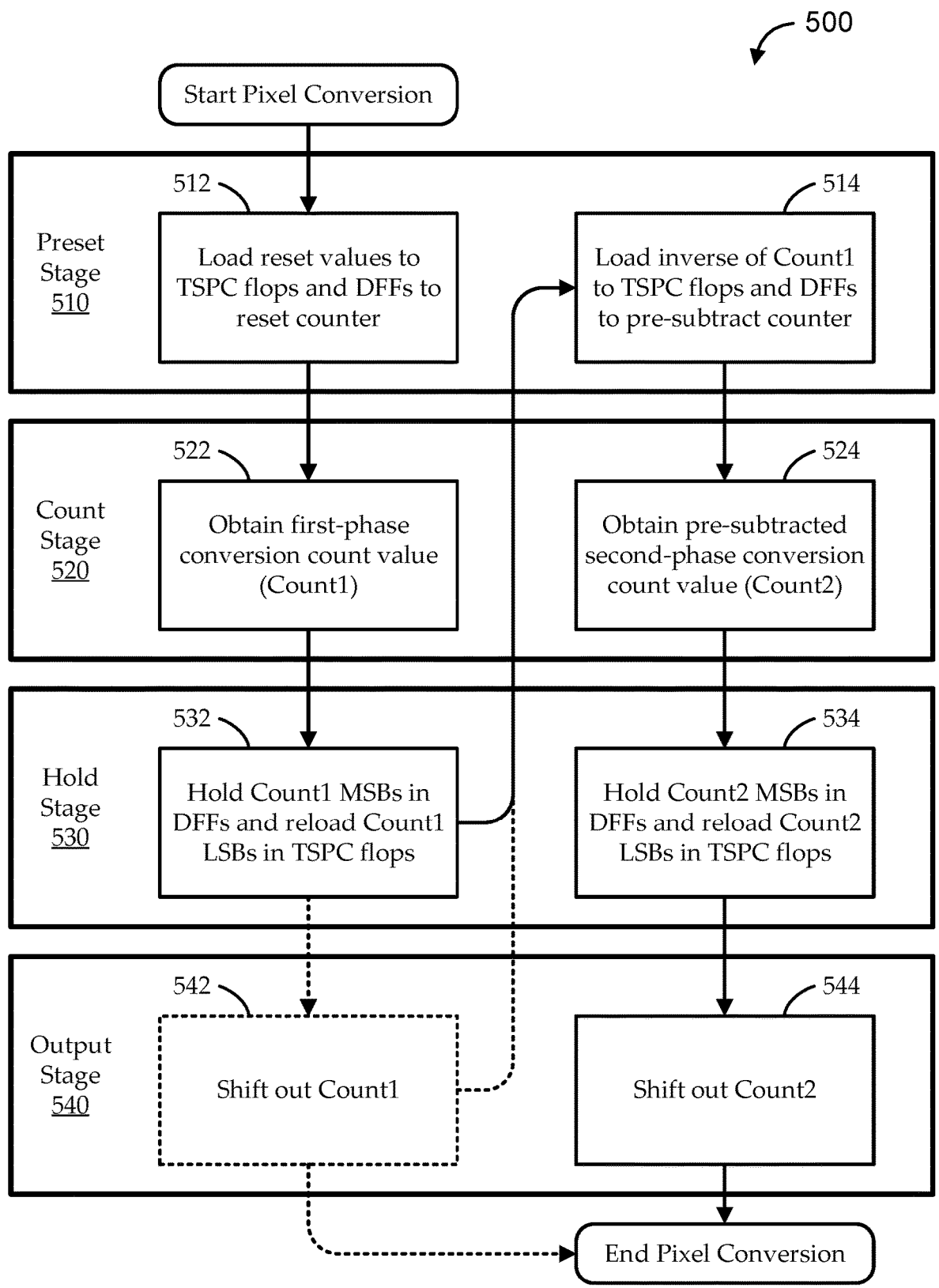
FIG. 5 shows a flow diagram of an illustrative method for pixel conversion counting using a loadable true-single-phase-clocking flop-based counter, according to various embodiments.

FIG. 5 shows a flow diagram of an illustrative method 500 for pixel conversion counting using a loadable true-single-phase-clocking (L-TSPC) flop-based counter, according to various embodiments. Embodiments of the method 500 can be performed using the counter architecture 300, and related components, for example as described with reference to FIGS. 3 and 4A-4E. In general, embodiments of the method 500 can proceed from a start of a pixel conversion cycle to an end of a pixel conversion cycle. The pixel conversion cycle includes one or more iterations of each of a preset stage 510, a count stage 520, a hold stage 530, and an output stage 540. Some embodiments provide a single-phase pixel conversion, which can follow the sequence: preset stage 510, count stage 520, hold stage 530, and output stage 540. Other embodiments provide a two-phase pixel conversion, which can follow the sequence: preset stage 510, count stage 520, hold stage 530, preset stage 510, count stage 520, hold stage 530, and output stage 540. Some two-phase pixel conversion embodiments can include an additional performance of the output stage 540 after the first hold stage 530.

Embodiments begin at stage 512 (in preset stage 510) by resetting a count value to an initial reset value in an N-bit counter block having M L-TSPC flops and N−M data flip-flops (DFFs). Embodiments can initialize the N-bit counter block by forcing outputs of the L-TSPC flops and the DFFs each to correspond to a respective bit of a predetermined N-bit reset value, such that the count value subsequent to the running corresponds to the number of clock cycles of an input clock signal as elapsed over the conversion timeframe plus the reset value. At stage 522 (in count stage 520), embodiments can run the N-bit counter block in a conversion timeframe defined by a ramp start signal and a ramp stop signal to update a count value. Updating the count value can involve configuring the L-TSPC flops and the DFFs to operate in a clock divider mode to count a number of clock cycles of an input clock signal as elapsed over the conversion timeframe, such that the L-TSPC flops represent M least significant bits (LSBs) of the count value, and the DFFs represent N−M most significant bits (MSBs) of the count value. Configuring the L-TSPC flops and the DFFs to operate in the clock divider mode can involve generating (e.g., by a flop loader) set/reset signals to configure respective set and reset inputs of the L-TSPC flops and the DFFs so that their respective outputs are a function of respective clocking inputs.

At stage 532 (in hold stage 530), embodiments can hold the LSBs of the count value, subsequent to the running, by latching the LSBs of the count value in TSPC latches coupled with the L-TSPC flops. As described herein, the holding can further include reloading each of the L-TSPC flops with a corresponding bit of the LSBs of the count value. For example, embodiments can generate (e.g., by a flop loader) set/reset signals to configure respective set and reset inputs of the L-TSPC flops so that the respective output of each of the L-TSPC flops is deterministically forced to a state based on its corresponding bit of the LSBs of the count value. In some embodiments, the count value obtained in stage 522 and held in stage 532 can be output in stage 542 (in output stage 540) by outputting the LSBs of the count value from the TSPC latches and by outputting the MSBs of the count value from the DFFs.

Some embodiments return to the preset stage 510 for a second phase of the conversion cycle. Some such embodiments return to the preset stage 510 directly from stage 532 (i.e., without outputting the count value at stage 542), and other such embodiments return to the preset stage 510 after outputting the count value at stage 542. The second iteration of the preset stage 510 can be used to perform a pre-subtraction. At stage 514 (in the preset stage), embodiments can pre-subtracting the count value held in stage 532 by inverting the count value to generate an inverted count value, and resetting the N-bit counter block to force outputs of the L-TSPC flops and the DFFs each to correspond to a respective bit of the inverted count value.

Embodiments of the method 500 can then proceed with obtaining an updated count value at stage 524 and holding the updated count value at stage 534 in a manner similar to stages 522 and 532, respectively. For example, at stage 524, embodiments can run the N-bit counter block in a second conversion timeframe, subsequent to the pre-subtracting, to update the count value by configuring the L-TSPC flops and the DFFs to operate in the clock divider mode to count the number of clock cycles of the input clock signal as elapsed over the second conversion timeframe. After the counting in stage 524, the count value corresponds to the number of clock cycles of the input clock signal as elapsed over the second conversion timeframe less the number of clock cycles of the input clock signal as elapsed over the first conversion timeframe (i.e., with the counting from stage 522 pre-subtracted). In stage 534, embodiments can hold the LSBs of the count value in the TSPC latches by updating the TSPC latches in accordance with the second running. In some embodiments, the count value obtained in stage 524 and held in stage 534 can be output in stage 544 (in output stage 540) by outputting the LSBs of the count value from the TSPC latches and by outputting the MSBs of the count value from the DFFs.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A loadable true-single-phase-clocking (L-TSPC) flop-based counter comprising:
   an N-bit counter block comprising:
      M L-TSPC flops and N–M data flip-flops (DFFs), the N-bit counter block configured to generate a count value indicating an N-bit number of elapsed clock cycles of an input clock signal received at a clocking input node, such that states of the L-TSPC flops represent M least significant bits (LSBs) of the count value, and states of the N–M data flip-flops (DFFs) represent N–M most significant bits (MSBs) of the count value,
      wherein M and N are positive integers, and each of the L-TSPC flops is loadable to a deterministic value based on respective set/reset signals; and
      a TSPC hold sub-block configured to couple with the L-TSPC flops to hold the M LSBs of the count value;
   a flop loader block configured to operate in a plurality of modes, such that:
      the flop loader block is configured, in a reset mode, to obtain M LSB reset values and N–M MSB reset values, to generate the respective set/reset signals to configure each of the L-TSPC flops into a load mode corresponding to a corresponding one of the LSB reset values, and to load each of the N–M MSB reset values to a corresponding one of the N–M DFFs;
      the flop loader block is configured, in a running mode, to generate the respective set/reset signals to configure the L-TSPC flops into a clock divider mode; and
      the flop loader block is configured, in a hold mode, to obtain the M LSBs of the count value from the TSPC hold sub-block, and generate the respective set/reset signals to configure each of the L-TSPC flops into the load mode corresponding to reloading a corresponding one of the LSBs of the count value; and
   a shift-out block coupled with the TSPC hold sub-block to output the M LSBs of the count value, and coupled with the DFFs to output the N–M MSBs of the count value.

2. The L-TSPC flop-based counter of claim 1, further comprising:
   a counter controller, coupled with the N-bit counter block and the flop loader block, and configured:
      in a first timeframe, to direct the flop loader block to operate in the reset mode to cause resetting of the count value in the N-bit counter block according to the LSB reset values and MSB reset values;
      in a second timeframe, to direct the flop loader block to operate in the running mode to cause the N-bit counter block to update the count value to indicate a clock running duration counted in the second timeframe; and
      in a third timeframe, to direct the TSPC hold sub-block to hold the M LSBs of the count value, and to direct the flop loader block to operate in the hold mode to cause reloading of the LSBs of the count value to the L-TSPC flops.

3. The L-TSPC flop-based counter of claim 2, wherein the counter controller is further configured, in a fourth timeframe, to direct the shift-out block to output the count value from the TSPC hold sub-block and the DFFs.

4. The L-TSPC flop-based counter of claim 1, further comprising:
a pre-subtractor block coupled with the N-bit counter block to receive the count value and to output an inverted count value,
wherein the flop loader block is configured to operate selectively further in a pre-subtract mode to obtain the inverted count value from the pre-subtractor block, to generate the respective set/reset signals to configure each of the L-TSPC flops into a load mode corresponding to a corresponding one of M LSBs of the inverted count value, and to load each of N−M MSBs of the inverted count value to a corresponding one of the N−M DFFs.

5. The L-TSPC flop-based counter of claim 4, further comprising:
a counter controller, coupled with the N-bit counter block, the flop loader block, and the pre-subtractor block, and configured:
in a first timeframe, to direct the flop loader block to operate in the reset mode to cause resetting of the count value in the N-bit counter block according to the LSB reset values and MSB reset values;
in a second timeframe, to direct the flop loader block to operate in the running mode to cause the N-bit counter block to update the count value to a first-updated count value indicating a first-phase clock running duration as counted during the second timeframe;
in a third timeframe, to direct the TSPC hold sub-block to hold the M LSBs of the first-updated count value, and to direct the flop loader block to operate in the hold mode to cause reloading of the LSBs of the first-updated count value to the L-TSPC flops;
in a fourth timeframe, to direct the flop loader block to operate in the pre-subtract mode to cause updating of the count value to a second-updated count value indicating the inverted count value obtained from the pre-subtractor block, the inverted count value being an inverse of the first-updated count value;
in a fifth timeframe, to direct the flop loader block to operate in the running mode to cause the N-bit counter block to update the count value to a third-updated count value indicating a second-phase clock running duration as counted during the fifth timeframe; and
in a sixth timeframe, to direct the TSPC hold sub-block to hold the M LSBs of the third-updated count value, and to direct the flop loader block to operate in the hold mode to cause reloading of the LSBs of the third-updated count value to the L-TSPC flops.

6. The L-TSPC flop-based counter of claim 5, wherein the counter controller is further configured, in a seventh timeframe, to direct the shift-out block to output the third-updated count value from the TSPC hold sub-block and the DFFs.

7. The L-TSPC flop-based counter of claim 1, wherein the flop loader block comprises:

N multiplexers (MUXs), each having a respective MUX output generated from a selected one of at least a respective first MUX input and a respective MUX second input, wherein:
for each of a first set of first through Mth MUXs, the respective first MUX input is coupled with a respective one of the LSB reset values, and the respective second MUX input is coupled with a respective one of the LSBs of the count value as output by the TSPC hold sub-block;
for each of a second set of (M+1)th to Nth MUXs, the respective first MUX input is coupled with a respective one of the MSB reset values, and the respective second MUX input is coupled with a respective one of the MSBs of the count value as output by the DFFs;
the flop loader block is configured, in the reset mode, to set each of the N MUXs so that each respective MUX output is generated from the respective first MUX input; and
the flop loader block is configured, in the hold mode, to set each of the N MUXs so that each respective MUX output is generated from the respective second MUX input.

8. The L-TSPC flop-based counter of claim 7, wherein each of the M L-TSPC flops corresponds to one of the first set of first through Mth MUXs, and the flop loader block further comprises:
a loading logic block configured to generate the respective set/reset signals for based on the respective MUX outputs of the first set of first through Mth MUXs, such that each of the L-TSPC flops is loaded to output a state indicative of the respective MUX output of its corresponding one of the first set of first through Mth MUXs.

9. The L-TSPC flop-based counter of claim 7, wherein the flop loader block further comprises:
a reset block to generate the LSB reset values and MSB reset values,
wherein, for each of a first set of first through Mth MUXs, the respective first MUX input is coupled with the respective one of the LSB reset values as generated by the reset block, and
wherein, for each of a second set of (M+1)th to Nth MUXs, the respective first MUX input is coupled with the respective one of the MSB reset values as generated by the reset block.

10. The L-TSPC flop-based counter of claim 1, wherein the shift-out block comprises:
first one or more transmission gates to couple with outputs of the TSPC hold sub-block to selectively output the LSBs of the count value;
second one or more transmission gates to couple with outputs of the DFFs to selectively output the N−M MSBs of the count value.

11. The L-TSPC flop-based counter of claim 1, wherein N is 11 and M is 5.

12. A method for pixel conversion counting using a loadable true-single-phase-clocking (L-TSPC) flop-based counter, the method comprising:
running an N-bit counter block having M L-TSPC flops and N−M data flip-flops (DFFs) in a conversion timeframe defined by a ramp start signal and a ramp stop signal to update a count value by configuring the L-TSPC flops and the DFFs to operate in a clock divider mode to count a number of clock cycles of an input clock signal as elapsed over the conversion timeframe, such that the L-TSPC flops represent M least significant bits (LSBs) of the count value, and the DFFs represent N−M most significant bits (MSBs) of the count value;

holding the LSBs of the count value, subsequent to the running, by latching the LSBs of the count value in TSPC latches coupled with the L-TSPC flops; and outputting the count value by outputting the LSBs of the count value from the TSPC latches and by outputting the MSBs of the count value from the DFFs.

13. The method of claim 12, further comprising:

initializing the N-bit counter block, prior to the running, by forcing outputs of the L-TSPC flops and the DFFs each to correspond to a respective bit of a predetermined N-bit reset value, such that the count value subsequent to the running corresponds to the number of clock cycles of an input clock signal as elapsed over the conversion timeframe plus the reset value.

14. The method of claim 12, wherein:

the holding further comprises reloading each of the L-TSPC flops with a corresponding bit of the LSBs of the count value by generating, by a flop loader, a plurality of set/reset signals to configure respective set and reset inputs of the L-TSPC flops so that the respective output of each of the L-TSPC flops is deterministically forced to a state based on its corresponding bit of the LSBs of the count value.

15. The method of claim 12, wherein the running is first running, the holding is first holding, and the conversion timeframe is a first conversion timeframe, and further comprising:

pre-subtracting the count value, subsequent to the first holding, by inverting the count value to generate an inverted count value, and resetting the N-bit counter block to force outputs of the L-TSPC flops and the DFFs each to correspond to a respective bit of the inverted count value;

second running the N-bit counter block in a second conversion timeframe, subsequent to the pre-subtracting, to update the count value by configuring the L-TSPC flops and the DFFs to operate in the clock divider mode to count the number of clock cycles of the input clock signal as elapsed over the second conversion timeframe, such that the count value after the second updating corresponds to the number of clock cycles of the input clock signal as elapsed over the second conversion timeframe less the number of clock cycles of the input clock signal as elapsed over the first conversion timeframe; and second holding the LSBs of the count value in the TSPC latches by updating the TSPC latches in accordance with the second running, wherein the outputting the count value comprises outputting the count value subsequent to the second holding.

16. The method of claim 15, wherein the outputting comprises:

first outputting the count value subsequent to the first holding; and second outputting the count value subsequent to the second holding.

17. The method of claim 12, wherein:

the configuring the L-TSPC flops and the DFFs to operate in the clock divider mode comprises generating, by a flop loader, a plurality of set/reset signals to configure respective set and reset inputs of the L-TSPC flops and the DFFs so that their respective outputs are a function of respective clocking inputs.

* * * * *